United States Patent
Kato

(10) Patent No.: US 9,401,533 B2
(45) Date of Patent: *Jul. 26, 2016

(54) FLAT CABLE

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/807,925

(22) Filed: Jul. 24, 2015

(65) Prior Publication Data

US 2015/0333388 A1 Nov. 19, 2015

Related U.S. Application Data

(63) Continuation of application No. 14/262,989, filed on Apr. 28, 2014, now Pat. No. 9,130,251, which is a continuation of application No. PCT/JP2013/066211, filed on Jun. 12, 2013.

(30) Foreign Application Priority Data

Jul. 30, 2012 (JP) ................................. 2012-168114

(51) Int. Cl.
*H01P 3/08* (2006.01)
*H05K 1/02* (2006.01)

(52) U.S. Cl.
CPC *H01P 3/08* (2013.01); *H01P 3/085* (2013.01); *H05K 1/028* (2013.01); *H05K 1/0242* (2013.01); *H05K 1/0253* (2013.01); *H05K 1/0221* (2013.01); *H05K 1/0225* (2013.01); *H05K 2201/055* (2013.01); *H05K 2201/0969* (2013.01); *H05K 2201/09618* (2013.01); *H05K 2201/09727* (2013.01)

(58) Field of Classification Search
CPC ............ H01P 3/08; H01P 3/085; H01P 3/087
USPC ................................ 333/1, 4, 5, 238, 246, 33
See application file for complete search history.

(56) References Cited

U.S. PATENT DOCUMENTS 9,130,251 B2 * 9/2015 Kato ........................ H01P 3/085

OTHER PUBLICATIONS

Kato, "Flat Cable", U.S. Appl. No. 14/262,989, filed Apr. 28, 2014.

* cited by examiner

*Primary Examiner* — Stephen E Jones
(74) *Attorney, Agent, or Firm* — Keating & Bennett, LLP

(57) ABSTRACT

A flat cable includes a dielectric element assembly including a plurality of dielectric layers laminated on each other, a linear signal line provided in the dielectric element assembly, a first ground conductor provided on one side in a direction of lamination relative to the signal line and including a plurality of first openings arranged along the signal line, and a second ground conductor provided on the other side in the direction of lamination relative to the signal line and including a plurality of second openings arranged along the signal line. The first ground conductor is more distant from the signal line in the direction of lamination than is the second ground conductor. The first openings are larger than the second openings.

5 Claims, 8 Drawing Sheets

F I G. 2
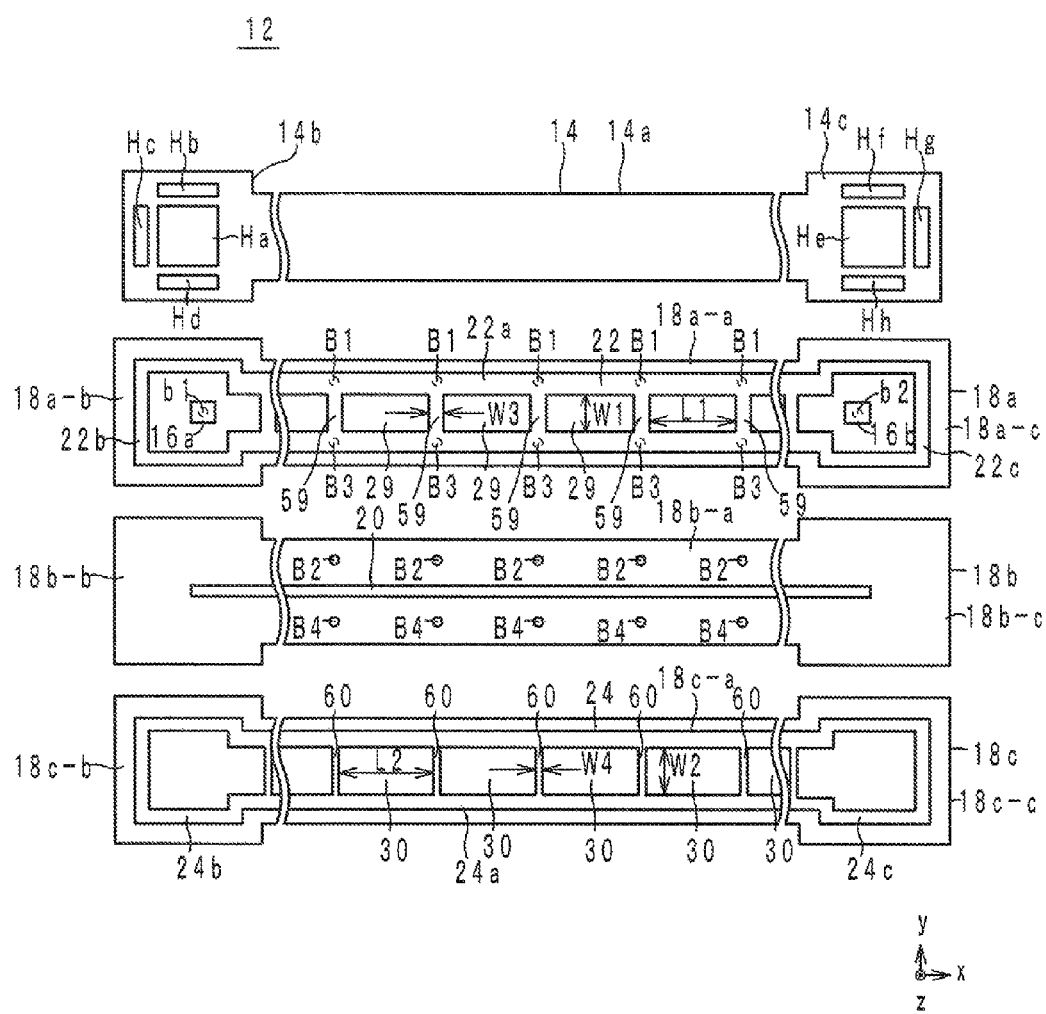

F I G. 4 A
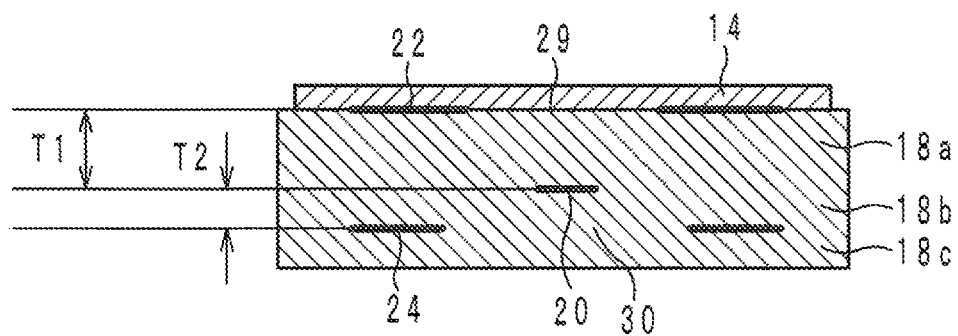
F I G. 4 B
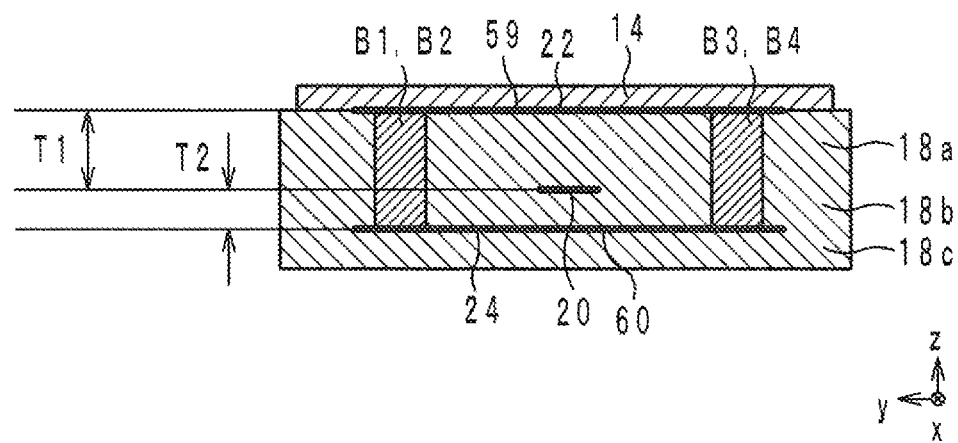

F I G . 5 A
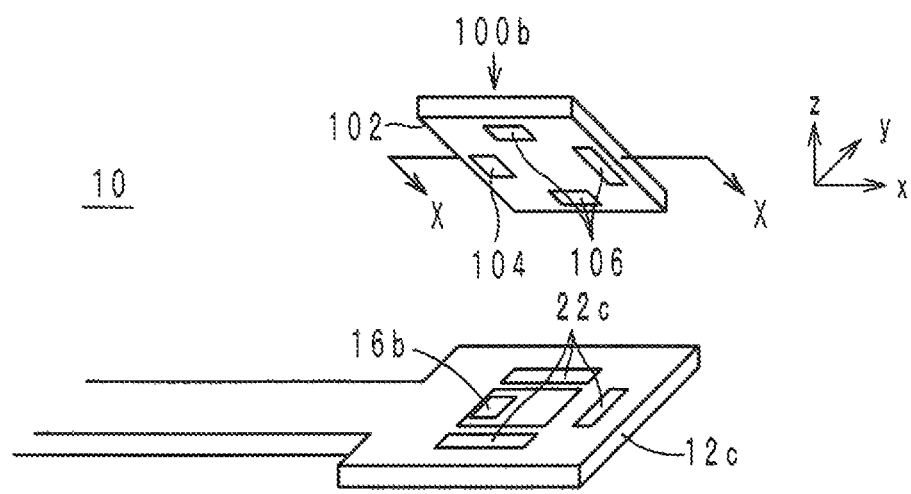
F I G . 5 B
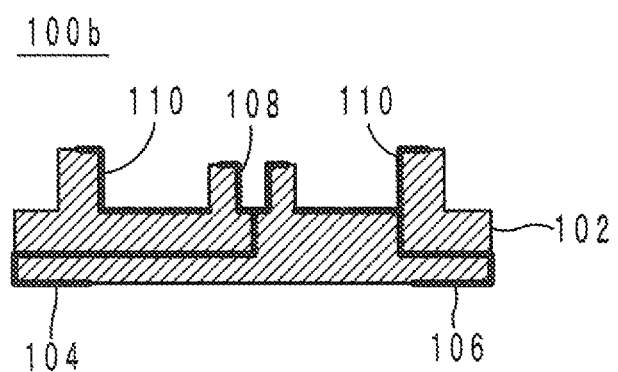

FLAT CABLE

This application is based on International Application No. PCT/JP2013/066211 filed on Jun. 12, 2013, and Japanese Patent Application No. 2012-168114 filed on Jul. 30, 2012, the entire contents of each of which is hereby incorporated herein by reference.

BACKGROUND OF THE INVENTION

1. Field of the Invention

The present invention relates to flat cables, more particularly to a flat cable for use in high-frequency signal transmission.

2. Description of the Related Art

As an invention related to a conventional flat cable, a high-frequency signal line described in, for example, International Publication No. WO2012/073591 (for example, see FIG. 9) is known. This high-frequency signal line includes a dielectric element assembly, a signal line, and two ground conductors. The dielectric element assembly is formed by laminating a plurality of dielectric sheets. The signal line is provided in the dielectric element assembly. The two ground conductors are provided in the dielectric element assembly such that the signal line is positioned therebetween in the direction of lamination. As a result, the signal line and the two ground conductors constitute a stripline structure.

Furthermore, each of the two ground conductors has a plurality of openings provided therein, and the openings overlap with the signal line when viewed in a plan view in the direction of lamination. This results in less capacitance being created between the signal line and the two ground conductors. Therefore, it is possible to reduce the distance between the signal line and the ground conductors in the direction of lamination, so that the high-frequency signal line can be reduced in thickness.

However, the high-frequency signal line described in International Publication No. WO2012/073591 has a problem in that the characteristic impedance of the signal line might fluctuate. More specifically, the high-frequency signal line described in International Publication No. WO2012/073591 is attached to a metallic object such as a battery pack. In this case, since the openings are provided in both of the ground conductors, the signal line faces the battery pack through the openings regardless of which side of the high-frequency signal line is directed to the battery pack. Accordingly, there is some capacitance created between the signal line and the battery pack, resulting in fluctuations in the characteristic impedance of the signal line.

Note that International Publication No. WO2011/007660 also describes a signal line having a stripline structure. This signal line also has openings provided in two ground conductors, and therefore, has a problem with fluctuations in the characteristic impedance of the signal line.

SUMMARY OF THE INVENTION

A flat cable according to a preferred embodiment of the present invention includes a dielectric element assembly including a plurality of dielectric layers laminated on each other, a linear signal line provided in the dielectric element assembly, a first ground conductor provided on one side in a direction of lamination relative to the signal line and including a plurality of first openings arranged along the signal line, and a second ground conductor provided on the other side in the direction of lamination relative to the signal line and including a plurality of second openings arranged along the signal line. The first ground conductor is more distant from the signal line in the direction of lamination than is the second ground conductor. The first openings are larger than the second openings.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is an exploded view of a dielectric element assembly of the flat cable in FIG. 1.

FIG. 4A is a cross-sectional structure view of the flat cable taken along line A-A of FIG. 3.

FIG. 4B is a cross-sectional structure view of the flat cable taken along line B-B of FIG. 3.

FIG. 5A is an external oblique view of a connector of the flat cable.

FIG. 5B is a cross-sectional structure view of the connector.

DETAILED DESCRIPTION OF THE PREFERRED EMBODIMENTS

Hereinafter, a flat cable according to preferred embodiments of the present invention will be described with reference to the drawings.

Figure 1:
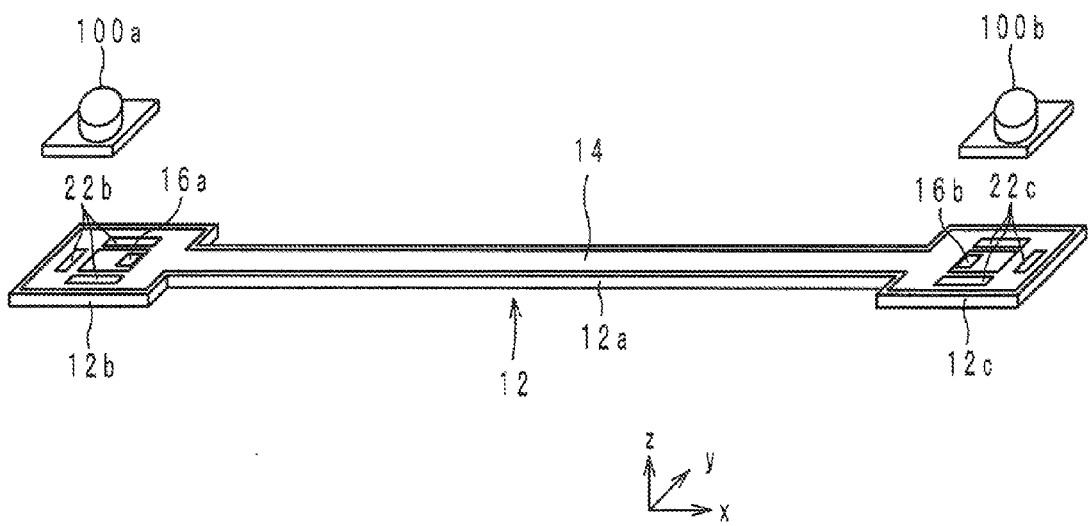
FIG. 1 is an external oblique view of a flat cable according to a preferred embodiment of the present invention.
Figure 3:
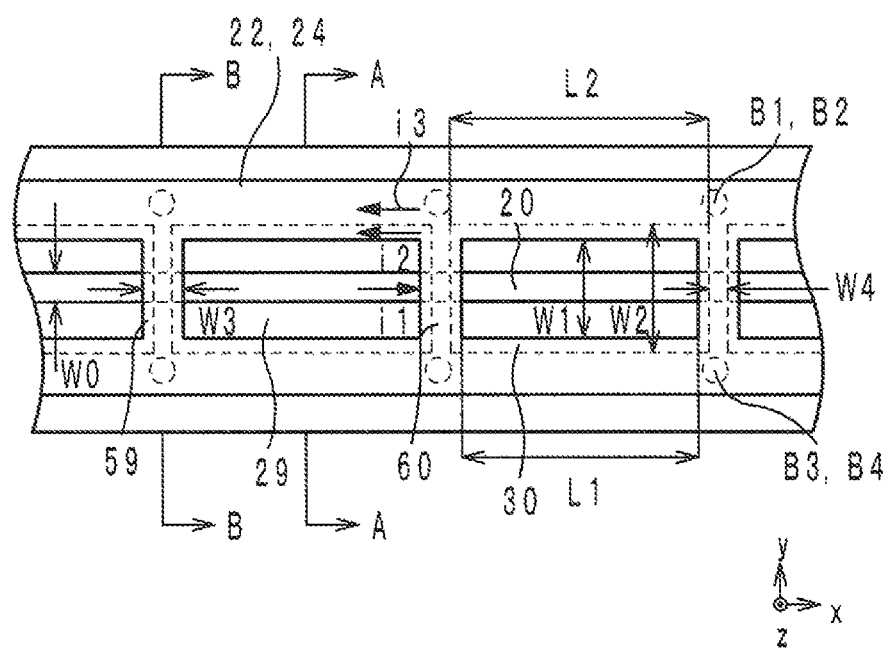
FIG. 3 illustrates a signal line, a reference ground conductor, and an auxiliary ground conductor of the flat cable as viewed in a plan view in the direction of lamination.

The configuration of the flat cable according to preferred embodiments of the present invention will be described below with reference to the drawings. FIG. 1 is an external oblique view of the flat cable 10 according to a preferred embodiment of the present invention. FIG. 2 is an exploded view of a dielectric element assembly 12 of the flat cable 10 in FIG. 1. FIG. 3 illustrates a signal line 20, a reference ground conductor 22, and an auxiliary ground conductor 24 of the flat cable 10 as viewed in a plan view in the direction of lamination. FIG. 4A is a cross-sectional structure view of the flat cable 10 taken along line A-A of FIG. 3. FIG. 4B is a cross-sectional structure view of the flat cable 10 taken along line B-B of FIG. 3. In the following description, the direction of lamination of the flat cable 10 will be defined as a z-axis direction. In addition, the longitudinal direction of the flat cable 10 will be defined as an x-axis direction, and the direction perpendicular to the x-axis and z-axis directions will be defined as a y-axis direction.

The flat cable 10 is preferably used in, for example, an electronic device such as a cell phone in order to connect two high-frequency circuits. The flat cable 10 includes the dielectric element assembly 12, external terminals 16a and 16b, the signal line 20, the reference ground conductor 22, the auxiliary ground conductor 24, via-hole conductors b1, b2, and B1 to B4, and connectors 100a and 100b, as shown in FIGS. 1 and 2.

The dielectric element assembly 12 is a flexible plate-shaped member, which extends in the x-axis direction when viewed in a plan view in the z-axis direction, and includes a line portion 12a and connecting portions 12b and 12c, as shown in FIG. 1. The dielectric element assembly 12 includes a laminate including a protective layer 14 and dielectric sheets 18a to 18c stacked in this order, from the positive side toward the negative side in the z-axis direction, as shown in FIG. 2. In the following, the principal surface of the dielectric element assembly 12 that is located on the positive side in the z-axis direction will be referred to as a front surface, and the principal surface of the dielectric element assembly 12 that is located on the negative side in the z-axis direction will be referred to as a back surface.

The line portion 12a extends in the x-axis direction, as shown in FIG. 2. The connecting portions 12b and 12c preferably rectangular or substantially rectangular portions connected to opposite ends of the line portion 12a on the negative and positive sides, respectively, in the x-axis direction. The width of each of the connecting portions 12b and 12c in the y-axis direction is greater than the width of the line portion 12a in the y-axis direction.

The dielectric sheets 18a to 18c, when viewed in a plan view in the z-axis direction, extend in the x-axis direction and have the same shape as the dielectric element assembly 12, as shown in FIG. 2. The dielectric sheets 18a to 18c are preferably made of flexible thermoplastic resin such as polyimide or liquid crystal polymer.

The thickness T1 of the dielectric sheet 18a is greater than the thickness T2 of the dielectric sheet 18b, as shown in FIG. 4. The thickness T1 preferably is, for example, about 50 μm to about 300 μm after the lamination of the dielectric sheets 18a to 18c. In the present preferred embodiment, the thickness T1 preferably is about 100 μm. Moreover, the thickness T2 preferably is, for example, about 10 μm to about 100 μm. In the present preferred embodiment, the thickness T2 preferably is about 50 μm, for example.

Furthermore, the dielectric sheet 18a includes a line portion 18a-a and connecting portions 18a-b and 18a-c. The dielectric sheet 18b includes a line portion 18b-a and connecting portions 18b-b and 18b-c. The dielectric sheet 18c includes a line portion 18c-a and connecting portions 18c-b and 18c-c. The line portions 18a-a, 18b-a, and 18c-a constitute the line portion 12a. The connecting portions 18a-b, 18b-b, and 18c-b constitute the connecting portion 12b. The connecting portions 18a-c, 18b-c, and 18c-c constitute the connecting portion 12c.

The signal line 20 is a linear conductor provided in the dielectric element assembly 12 so as to transmit a high-frequency signal, as shown in FIG. 2. In the present preferred embodiment, the signal line 20 is provided on the front surface of the dielectric sheet 18b. The signal line 20 extends along the line portion 18b-a in the x-axis direction. The end of the signal line 20 on the negative side in the x-axis direction is positioned approximately at the center of the connecting portion 18b-b. The end of the signal line 20 on the positive side in the x-axis direction is positioned approximately at the center of the connecting portion 18b-c. The signal line 20 transmits a high-frequency signal therethrough. The width W0 of the signal line 20 (see FIG. 3) preferably is, for example, about 300 μm to about 700 μm. In the present preferred embodiment, the width of the signal line 20 preferably is about 300 μm, for example. The signal line 20 is preferably made of a metal material mainly composed of silver or copper and having a low specific resistance. Preferably, the signal line 20 is formed by patterning metal foil formed by plating the front surface of the dielectric sheet 18b or by patterning metal foil attached to the front surface of the dielectric sheet 18b. Moreover, the surface of the signal line 20 is smoothened, so that surface roughness of the signal line 20 is greater on the side that contacts the dielectric sheet 18b than on the side that does not contact the dielectric sheet 18b.

The reference ground conductor 22 is positioned on the positive side in the z-axis direction relative to the signal line 20. The reference ground conductor 22 includes a plurality of openings 29 arranged along the signal line 20. More specifically, the reference ground conductor 22 is provided on the front surface of the dielectric sheet 18a so as to be opposite to the signal line 20 with the dielectric sheet 18a positioned therebetween. The reference ground conductor 22 is preferably made of a metal material mainly composed of silver or copper and having a low specific resistance. Here, the reference ground conductor 22 is preferably formed by patterning metal foil formed by plating the front surface of the dielectric sheet 18a or by patterning metal foil attached to the front surface of the dielectric sheet 18a. Moreover, the surface of the reference ground conductor 22 is smoothened, so that surface roughness of the reference ground conductor 22 is greater on the side that contacts the dielectric sheet 18a than on the side that does not contact the dielectric sheet 18a.

Furthermore, the reference ground conductor 22 includes a line portion 22a and terminal portions 22b and 22c. The line portion 22a is provided on the front surface of the line portion 18a-a so as to extend in the x-axis direction. The terminal portion 22b is provided in the form of a rectangular loop on the front surface of the connecting portion 18a-b. The terminal portion 22b is connected to the end of the line portion 22a on the negative side in the x-axis direction. The terminal portion 22c is provided in the form of a rectangular or substantially loop on the front surface of the connecting portion 18a-c. The terminal portion 22c is connected to the end of the line portion 22a on the positive side in the x-axis direction.

Furthermore, the line portion 22a includes a plurality of rectangular or substantially rectangular openings 29 provided so as to extend in the x-axis direction, as shown in FIG. 2. Accordingly, the reference ground conductor 22 is in the form of a ladder in the line portion 22a. Moreover, the portions of the reference ground conductor 22 that are positioned between adjacent openings 29 will be referred to as bridge portions 59. The openings 29 and the bridge portions 59, when viewed in a plan view in the z-axis direction, alternatingly overlap with the signal line 20. In the present preferred embodiment, the signal line 20 crosses the openings 29 and the bridge portions 59 in the x-axis direction, approximately at their centers in the y-axis direction.

The auxiliary ground conductor 24 is positioned on the negative side in the z-axis direction relative to the signal line 20. The auxiliary ground conductor 24 has a plurality of openings 30 arranged along the signal line 20. More specifically, the auxiliary ground conductor 24 is provided on the front surface of the dielectric sheet 18c so as to be opposite to the signal line 20 with the dielectric sheet 18b positioned therebetween. The auxiliary ground conductor 24 is made of a metal material mainly composed of silver or copper and having a low specific resistance. Here, the auxiliary ground conductor 24 is preferably formed by patterning metal foil formed by plating the front surface of the dielectric sheet 18c or by patterning metal foil attached to the front surface of the dielectric sheet 18c. Moreover, the surface of the auxiliary ground conductor 24 is smoothened, so that surface roughness of the auxiliary ground conductor 24 is greater on the side that contacts the dielectric sheet 18c than on the side that does not contact the dielectric sheet 18c.

Furthermore, the auxiliary ground conductor 24 includes a line portion 24a and terminal portions 24b and 24c. The line portion 24a is provided on the front surface of the line portion 18c-a so as to extend in the x-axis direction. The terminal portion 24b is provided in the form of a rectangular or substantially rectangular loop on the front surface of the connecting portion 18c-b. The terminal portion 24b is connected to the end of the line portion 24a on the negative side in the x-axis direction. The terminal portion 24c is provided in the form of a rectangular or substantially rectangular loop on the front surface of the connecting portion 18c-c. The terminal portion 24c is connected to the end of the line portion 24a on the positive side in the x-axis direction.

Furthermore, the line portion 24a includes a plurality of rectangular or substantially rectangular openings 30 provided so as to extend in the x-axis direction, as shown in FIG. 2. Accordingly, the auxiliary ground conductor 24 is in the form of a ladder in the line portion 24a. Moreover, the portions of the auxiliary ground conductor 24 that are positioned between adjacent openings 30 will be referred to as bridge portions 60. The bridge portions 60 extend in the y-axis direction. The openings 30 and the bridge portions 60, when viewed in a plan view in the z-axis direction, alternatingly overlap with the signal line 20. In the present preferred embodiment, the signal line 20 crosses the openings 30 and the bridge portions 60 in the x-axis direction, approximately at their centers in the y-axis direction.

The openings 29 and 30 and the bridge portions 59 and 60 will now be described in terms of their sizes and positional relationship with reference to FIG. 3. The openings 29 and 30 overlap with each other, as shown in FIG. 3. The openings 29 are smaller than the openings 30. More specifically, the width W1 of the openings 29 in the y-axis direction, which is perpendicular to the direction (x-axis direction) in which the signal line 20 extends, is less than the width W2 of the openings 30 in the y-axis direction. The width W1 of the openings 29 preferably is, for example, from about 500 µm to about 900 µm. The width W2 of the openings 30 preferably is, for example, from about 1000 µm to about 2000 µm. In addition, the length L1 of the openings 29 in the x-axis direction is shorter than the length L2 of the openings 30 in the x-axis direction. The length L1 of the openings 29 preferably is, for example, from about 2 mm to about 7 mm. The length L2 of the openings 30 preferably is, for example, from about 2 mm to about 7 mm. The openings 29, when viewed in a plan view in the z-axis direction, are positioned within the openings 30. Accordingly, when viewed in a plan view in the z-axis direction, the edges of the openings 29 do not overlap with the edges of the openings 30.

Furthermore, the bridge portions 60 overlap with the bridge portions 59, as shown in FIG. 3. The width W3 of the bridge portions 59 are greater than the width W4 of the bridge portions 60. The width W3 of the bridge portions 59 preferably is, for example, from about 50 µm to about 200 µm. The width W4 of the bridge portions 60 preferably is, for example, from about 50 µm to about 200 µm. Accordingly, when viewed in a plan view in the z-axis direction, the bridge portions 60 overlap with the bridge portions 59 without extending beyond the edges of bridge portions 59.

The external terminal 16a is a rectangular or substantially rectangular conductor provided at the center of the front surface of the connecting portion 18a-b, as shown in FIGS. 1 and 2. Accordingly, the external terminal 16a, when viewed in a plan view in the z-axis direction, overlaps with the end of the signal line 20 on the negative side in the x-axis direction. The external terminal 16b is a rectangular or substantially rectangular conductor provided at the center of the front surface of the connecting portion 18a-c, as shown in FIGS. 1 and 2. Accordingly, the external terminal 16b, when viewed in a plan view in the z-axis direction, overlaps with the end of the signal line 20 on the positive side in the x-axis direction. The external terminals 16a and 16b are preferably made of a metal material mainly composed of silver or copper and having a low specific resistance. Moreover, the surfaces of the external terminals 16a and 16b are plated with Ni and Au. Here, the external terminals 16a and 16b are preferably formed by patterning metal foil formed by plating the front surface of the dielectric sheet 18a or by patterning metal foil attached to the front surface of the dielectric sheet 18a. Moreover, the surfaces of the external terminals 16a and 16b are smoothened, so that surface roughness of the external terminals 16a and 16b is greater on the side that contacts the dielectric sheet 18a than on the side that does not contact the dielectric sheet 18a.

As described above, the signal line 20 is positioned between the reference ground conductor 22 and the auxiliary ground conductor 24 in the z-axis direction. That is, the signal line 20, the reference ground conductor 22, and the auxiliary ground conductor 24 constitute a triplate stripline structure. Moreover, the gap between the signal line 20 and the reference ground conductor 22 (their distance in the z-axis direction) is equal or approximately equal to the thickness T1 of the dielectric sheet 18a, as shown in FIG. 4, and it preferably is, for example, about 50 µm to about 300 µm. In the present preferred embodiment, the gap between the signal line 20 and the reference ground conductor 22 preferably is about 100 µm. On the other hand, the gap between the signal line 20 and the auxiliary ground conductor (their distance in the z-axis direction) is equal or approximately equal to the thickness T2 of the dielectric sheet 18b, as shown in FIG. 4, and it preferably is, for example, about 10 µm to about 100 µm. In the present preferred embodiment, the gap between the signal line 20 and the auxiliary ground conductor 24 preferably is about 50 µm. That is, the distance between the reference ground conductor 22 and the signal line 20 in the z-axis direction is designed to be greater than the distance between the auxiliary ground conductor 24 and the signal line 20 in the z-axis direction.

The via-hole conductor b1 pierces through the connecting portion 18a-b of the dielectric sheet 18a in the z-axis direction, thus connecting the external terminal 16a to the end of the signal line 20 that is located on the negative side in the x-axis direction. The via-hole conductor b2 pierces through the connecting portion 18a-c of the dielectric sheet 18a in the z-axis direction, thus connecting the external terminal 16b to the end of the signal line 20 that is located on the positive side in the x-axis direction. As a result, the signal line 20 is connected between the external terminals 16a and 16b. The via-hole conductors b1 and b2 are formed preferably by providing a metallic material in through-holes made in the dielectric sheet 18a.

The via-hole conductors B1 pierce through the line portion 18a-a of the dielectric sheet 18a in the z-axis direction. The via-hole conductors B1 are aligned in the x-axis direction so as to be positioned on the positive side in the y-axis direction relative to the bridge portions 59 and 60, as shown in FIG. 2. The via-hole conductors B2 pierce through the line portion 18b-a of the dielectric sheet 18b in the z-axis direction. The via-hole conductors B2 are aligned in the x-axis direction so as to be positioned on the positive side in the y-axis direction relative to the bridge portions 59 and 60, as shown in FIG. 2. The via-hole conductors B1 and B2 are paired and connected, such that each pair constitutes a single via-hole conductor, thus connecting the reference ground conductor 22 and the auxiliary ground conductor 24. The via-hole conductors B1 and B2 are preferably formed by providing a metallic material in through-holes made in the dielectric sheets 18a and 18b.

The via-hole conductors B3 pierce through the line portion 18a-a of the dielectric sheet 18a in the z-axis direction. The via-hole conductors B3 are aligned in the x-axis direction so as to be positioned on the negative side in the y-axis direction relative to the bridge portions 59 and 60, as shown in FIG. 2. The via-hole conductors B4 pierce through the line portion 18b-a of the dielectric sheet 18b in the z-axis direction. The via-hole conductors B4 are aligned in the x-axis direction so as to be positioned on the negative side in the y-axis direction relative to the bridge portions 59 and 60, as shown in FIG. 2. The via-hole conductors B3 and B4 are paired and connected, such that each pair constitutes a single via-hole conductor, thus connecting the reference ground conductor 22 and the auxiliary ground conductor 24. The via-hole conductors B3 and B4 are preferably formed by providing a metallic material in through-holes made in the dielectric sheets 18a and 18b.

The protective layer 14 is an insulating film that covers approximately the entire front surface of the dielectric sheet 18a. Accordingly, the protective layer 14 covers the reference ground conductor 22 as well. The protective layer 14 is made of, for example, flexible resin such as a resist material.

Furthermore, the protective layer 14 includes a line portion 14a and connecting portions 14b and 14c, as shown in FIG. 2. The line portion 14a covers the front surface of the line portion 18a-a entirely, thus covering the line portion 22a.

The connecting portion 14b is connected to the end of the line portion 14a on the negative side in the x-axis direction, and covers the front surface of the connecting portion 18a-b. The connecting portion 14b includes openings Ha to Hd provided therein. The opening Ha is a rectangular or substantially rectangular opening provided at the center of the connecting portion 14b. The external terminal 16a is exposed to the outside through the opening Ha. The opening Hb is a rectangular or substantially rectangular opening provided on the positive side in the y-axis direction relative to the opening Ha. The opening Hc is a rectangular or substantially rectangular opening provided on the negative side in the x-axis direction relative to the opening Ha. The opening Hd is a rectangular or substantially rectangular opening provided on the negative side in the y-axis direction relative to the opening Ha. The terminal portion 22b is exposed to the outside through the openings Hb to Hd, so as to define and function as an external terminal.

The connecting portion 14c is connected to the end of the line portion 14a that is located on the positive side in the x-axis direction, and covers the front surface of the connecting portion 18a-c. The connecting portion 14c includes openings He to Hh provided therein. The opening He is a rectangular or substantially rectangular opening provided at the center of the connecting portion 14c. The external terminal 16b is exposed to the outside through the opening He. The opening Hf is a rectangular or substantially rectangular opening provided on the positive side in the y-axis direction relative to the opening He. The opening Hg is a rectangular or substantially rectangular opening provided on the positive side in the x-axis direction relative to the opening He. The opening Hh is a rectangular or substantially rectangular opening provided on the negative side in the y-axis direction relative to the opening He. The terminal portion 22c is exposed to the outside through the openings Hf to Hh, and therefore defines and functions as an external terminal.

In the case of the flat cable 10 thus configured, the characteristic impedance of the signal line 20 cyclically fluctuates between impedance values Z1 and Z2. More specifically, there is relatively low capacitance created between the signal line 20 and the reference ground conductor 22 and also between the signal line 20 and the auxiliary ground conductor 24, where the signal line 20 overlaps with the openings 29 and 30. Therefore, the characteristic impedance of the signal line 20 takes the value Z1, which is relatively high, where the signal line 20 overlaps with the openings 29 and 30.

On the other hand, there is relatively high capacitance created between the signal line 20 and the reference ground conductor 22 and also between the signal line 20 and the auxiliary ground conductor 24, where the signal line 20 overlaps with the bridge portions 59 and 60. Therefore, the characteristic impedance of the signal line 20 takes the value Z2, which is relatively low, where the signal line 20 overlaps with the bridge portions 59 and 60. The openings 29 and the bridge portions 59 alternate with each other in the x-axis direction, and the openings 30 and the bridge portions 60 alternate with each other in the x-axis direction. Accordingly, the characteristic impedance of the signal line 20 cyclically fluctuates between the impedance values Z1 and Z2. The impedance value Z1 is, for example, 55Ω, and the impedance value Z2 is, for example, 45Ω. The average characteristic impedance of the entire signal line 20 is, for example, 50Ω.

The connectors 100a and 100b are mounted on the front surfaces of the connecting portions 12b and 12c, respectively, as shown in FIG. 1. The connectors 100a and 100b have the same configuration, and therefore, the configuration of the connector 100b will be taken as an example in the following description. FIG. 5A is an external oblique view of the connector 100b of the flat cable 10, and FIG. 5B is a cross-sectional structure view of the connector 100b.

The connector 100b includes a connector body 102, external terminals 104 and 106, a center conductor 108, and an external conductor 110, as shown in FIGS. 1, 5A, and 5B. The connector body 102 includes a rectangular or substantially rectangular plate member and a cylindrical or substantially cylindrical member coupled thereon, and is made of an insulating material such as resin.

The external terminal 104 is positioned on the plate member of the connector body 102 on the negative side in the z-axis direction, so as to face the external terminal 16b. The external terminal 106 is positioned on the plate member of the connector body 102 on the negative side in the z-axis direction, so as to correspond to the portions of the terminal portion 22c that are exposed from the openings Hf to Hh.

The center conductor 108 is positioned at the center of the cylindrical member of the connector body 102, and is connected to the external terminal 104. The center conductor 108 is a signal terminal to/from which a high-frequency signal is inputted/outputted. The external conductor 110 is positioned on the inner circumferential surface of the cylindrical member of the connector body 102, and is connected to the external terminal 106. The external conductor 110 is a ground terminal to be kept at a ground potential.

The connector 100b thus configured is mounted on the front surface of the connecting portion 12c, as shown in FIG. 5, such that the external terminal 104 is connected to the external terminal 16b, and the external terminal 106 is connected to the terminal portion 22c. As a result, the signal line 20 is electrically connected to the center conductor 108. In addition, the reference ground conductor 22 and the auxiliary ground conductor 24 are electrically connected to the external conductor 110.

Note that the connectors 100a and 100b do not have to be provided. Specifically, external connections may be provided, for example, by disposing the external terminals 104 and 106 on the front surfaces of the connecting portions 12b and 12c as electrodes for external connections.

Figure 6A:
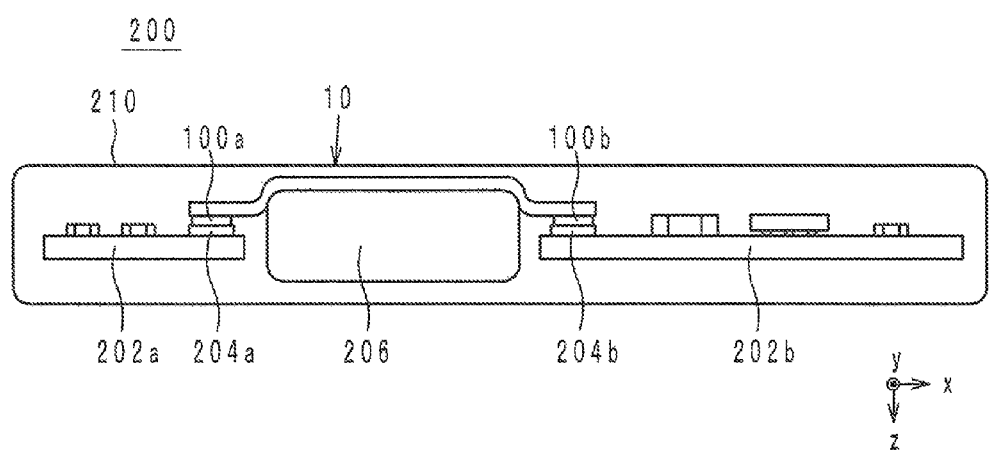
FIG. 6A illustrates an electronic device provided with the flat cable as viewed in a plan view in the y-axis direction.
Figure 6B:
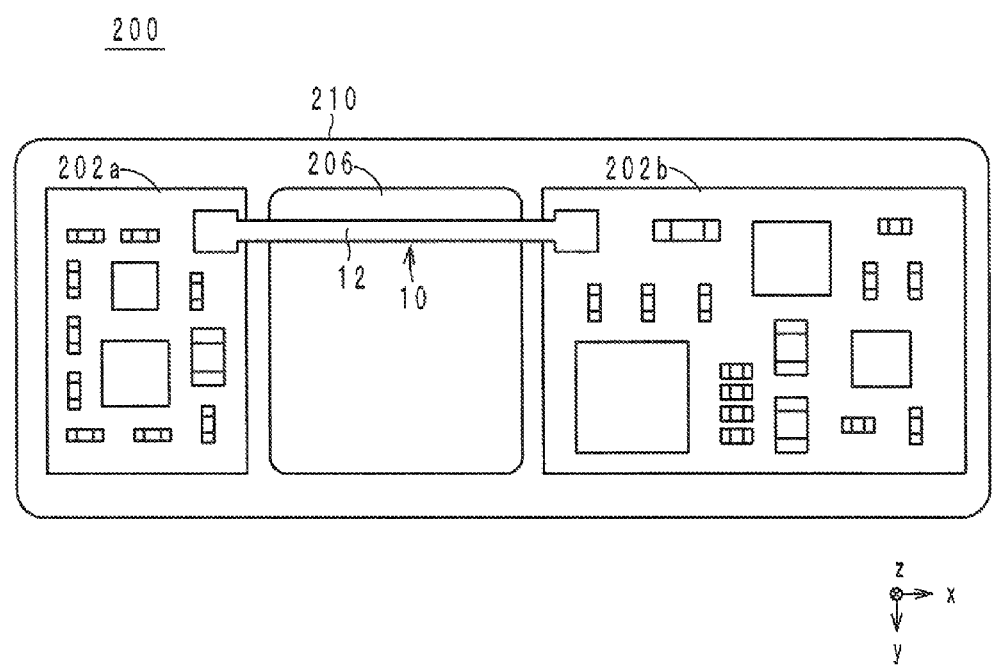
FIG. 6B illustrates the electronic device provided with the flat cable as viewed in a plan view in the z-axis direction.

The flat cable 10 is used in the manner as will be described below. FIGS. 6A and 6B illustrate an electronic device 200 provided with the flat cable 10 as viewed in plan views in the y-axis and z-axis directions, respectively.

The electronic device 200 includes the flat cable 10, circuit boards 202a and 202b, receptacles 204a and 204b, a battery pack (metallic object) 206, and a housing 210.

For example, the circuit board 202a has provided thereon a transmission or reception circuit including an antenna. The circuit board 202b includes, for example, a power circuit provided thereon. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The receptacles 204a and 204b are provided on the principal surfaces of the circuit boards 202a and 202b, respectively, on the negative side in the z-axis direction. The receptacles 204a and 204b are connected to the connectors 100a and 100b, respectively. As a result, high-frequency signals to be transmitted between the circuit boards 202a and 202b at a frequency of, for example, about 2 GHz are applied to the center conductors 108 of the connectors 100a and 100b via the receptacles 204a and 204b, respectively. Moreover, the external conductors 110 of the connectors 100a and 100b are kept at a ground potential by the circuit boards 202a and 202b and the receptacles 204a and 204b. Thus, the flat cable 10 connects the circuit boards 202a and 202b.

Here, the front surface of the dielectric element assembly 12 (more specifically, the protective layer 14) is in contact with the battery pack 206. The dielectric element assembly 12 and the battery pack 206 are fixed by an adhesive or the like. The front surface of the dielectric element assembly 12 is a principal surface positioned on the side of the reference ground conductor 22 relative to the signal line 20. Accordingly, the reference ground conductor 22 provided with the openings 29, which are relatively small-sized, is positioned between the signal line 20 and the battery pack 206.

Note that in the case of the flat cable 10 used in the electronic device 200 shown in FIGS. 6A and 6B, the connectors 100a and 100b are connected to the receptacles 204a and 204b, thus connecting the circuit boards 202a and 202b, but, for example, the flat cable 10 does not have to be provided with the connectors, and may be provided with electrodes for external connections, which are connected to land electrodes of the circuit boards 202a and 202b by conductive materials or the like.

The method for producing the flat cable 10 will be described below with reference to FIG. 2. While the following description focuses on one flat cable 10 as an example, in actuality, large-sized dielectric sheets are laminated and cut, so that a plurality of flat cables 10 are produced at the same time.

Prepared first are dielectric sheets 18a to 18c made of a thermoplastic resin and having their entire front surfaces copper-foiled (i.e., coated with metal films). More specifically, copper foil is attached to the front surfaces of the dielectric sheets 18a to 18c. Moreover, the copper-foiled surfaces of the dielectric sheets 18a to 18c are smoothened, for example, by galvanization for rust prevention. The dielectric sheets 18a to 18c preferably are sheets of liquid crystal polymer. The thickness of the copper foil preferably is about 10 µm to about 20 µm, for example.

Next, external terminals 16a and 16b and a reference ground conductor 22, as shown in FIG. 2, are formed on the front surface of the dielectric sheet 18a preferably by patterning the copper foil on the front surface of the dielectric sheet 18a. More specifically, resists are printed on the copper foil on the front surface of the dielectric sheet 18a in the same patterns as the external terminals 16a and 16b and the reference ground conductor 22 shown in FIG. 2. Then, any portions of the copper foil that are not coated with the resists are removed by etching. Thereafter, the resists are removed by spraying a resist liquid thereon. As a result, the external terminals 16a and 16b and the reference ground conductor 22 are formed on the front surface of the dielectric sheet 18a by photolithography, as shown in FIG. 2.

Next, a signal line 20, as shown in FIG. 2, is formed on the front surface of the dielectric sheet 18b. In addition, an auxiliary ground conductor 24, as shown in FIG. 2, is formed on the front surface of the dielectric sheet 18c. Note that the above steps of forming the signal line 20 and the auxiliary ground conductor 24 are similar to the steps for forming the external terminals 16a and 16b and the reference ground conductor 22, and therefore, any descriptions thereof will be omitted.

Next, via-holes are bored through the dielectric sheets 18a and 18b by irradiating the sheets with laser beams where via-hole conductors b1, b2, and B1 to B4 are to be formed. Thereafter, the via-holes are filled with a conductive paste, thus forming the via-hole conductors b1, b2, and B1 to B4. Note that instead of forming the via-hole conductors b1, b2, and B1 to B4, through-hole conductors may be formed, for example, by plating through-holes for interlayer connection of the dielectric sheet 18a.

Next, the dielectric sheets 18a to 18c are stacked in this order, from the positive side to the negative side in the z-axis direction, thus forming a dielectric element assembly 12. Thereafter, the dielectric sheets 18a to 18c are heated and pressed from both the positive and negative sides in the z-axis direction, such that the dielectric sheets 18a to 18c are integrated.

Next, a resin (resist) paste is applied to the front surface of the dielectric sheet 18a by screen printing, thus forming a protective layer 14 on the front surface of the dielectric sheet 18a so as to cover the reference ground conductor 22.

Lastly, connectors 100a and 100b are soldered to the external terminals 16a and 16b and terminal portions 22b and 22c on connecting portions 12b and 12c. As a result, the flat cable 10 shown in FIG. 1 is obtained.

The flat cable 10 thus configured is significantly reduced in thickness. More specifically, the flat cable 10 includes the openings 29 provided in the reference ground conductor 22 and the openings 30 provided in the auxiliary ground conductor 24. Accordingly, less capacitance is created between the signal line 20 and the reference ground conductor 22 and also between the signal line 20 and the auxiliary ground conductor 24. Therefore, even when the distance between the signal line 20 and the reference ground conductor 22 in the z-axis direction and the distance between the signal line 20 and the auxiliary ground conductor 24 in the z-axis direction are reduced, capacitance to be created between the signal line 20 and the reference ground conductor 22 and also between the signal line 20 and the auxiliary ground conductor 24 does not become excessively large. As a result, the characteristic impedance of the signal line 20 can be readily adjusted to a predetermined value (e.g., about 50Ω). Thus, it is possible to reduce the thickness of the flat cable 10 while maintaining the characteristic impedance of the signal line 20 at a predetermined value.

Furthermore, the flat cable 10 renders it possible to prevent fluctuations in the characteristic impedance of the signal line 20. More specifically, in the flat cable 10, the openings 29 are smaller than the openings 30. More specifically, the width W1 of the openings 29 is less than the width W2 of the openings 30, and the length L1 of the openings 29 is less than the length L2 of the openings 30. Accordingly, the front surface of the flat cable 10 is attached to the battery pack 206. The front surface of the flat cable 10 is a principal surface located on the side of the reference ground conductor 22 relative to the signal line 20. The reference ground conductor 22 has the relatively small-sized openings 29 provided therein. As a result, the flat cable 10 has only a small number of lines of electric force directed from the signal line 20 through the openings 29 toward the battery pack 206. Therefore, floating capacitance created between the signal line 20 and the battery pack 206 is reduced, so that the characteristic impedance of the signal line 20 is prevented from fluctuating. In addition, since less floating capacitance is created between the signal line 20 and the battery pack 206, the flat cable 10 and the battery pack 206 are disposed close to each other.

Furthermore, the flat cable 10 renders it possible to achieve reduction in insertion loss. More specifically, in the case of the flat cable 10, when a current i1 flows through the signal line 20, a feedback current (countercurrent) i2 flows through the reference ground conductor 22, and a feedback current (countercurrent) i3 flows through the auxiliary ground conductor 24, as shown in FIG. 3. When the flat cable 10 is viewed in a plan view in the z-axis direction, the edges of the openings 29 do not overlap with the edges of the openings 30. Accordingly, the position where the feedback current (countercurrent) i2 flows is distanced from the position where the feedback current (countercurrent) i3 flows. As a result, magnetic-field coupling caused by flows of the feedback currents (countercurrents) i2 and i3 is weakened, so that the current i1 can flow more readily, resulting in reduced insertion loss in the flat cable 10. Moreover, the feedback currents (countercurrents) i2 and i3 flow independently of each other, and therefore, resistance to the currents flowing through the reference ground conductor 22 and the auxiliary ground conductor 24 is low, so that the current i1 flows more readily.

Furthermore, for the following reasons also, the flat cable 10 renders it possible to prevent fluctuations in the characteristic impedance of the signal line 20. More specifically, the high-frequency signal line described in International Publication No. WO2012/073591 has congruent openings provided in two ground conductors, and the openings overlap with each other completely when viewed in a plan view in the direction of lamination. Accordingly, if the dielectric element assembly of the high-frequency signal line is poorly layered upon lamination so that the layers deviate from one other, the openings also deviate from each other. As a result, the size of the area where the ground conductors face each other changes, resulting in a change in the capacitance to be created between the ground conductors, and causing fluctuations in the characteristic impedance of the signal line.

Therefore, in the flat cable 10, the openings 29 are positioned within the openings 30 when they are viewed in a plan view in the z-axis direction. This prevents the openings 29 from extending beyond the openings 30 even if the dielectric element assembly 12 is poorly layered upon lamination, resulting in a deviation in the positional relationship between the openings 29 and 30. That is, the size of the area where the reference ground conductor 22 and the auxiliary ground conductor 24 face each other is prevented from being changed, and the capacitance created between the reference ground conductor 22 and the auxiliary ground conductor 24 is also prevented from being changed, so that the characteristic impedance of the signal line 20 can be prevented from fluctuating.

Figure 7:
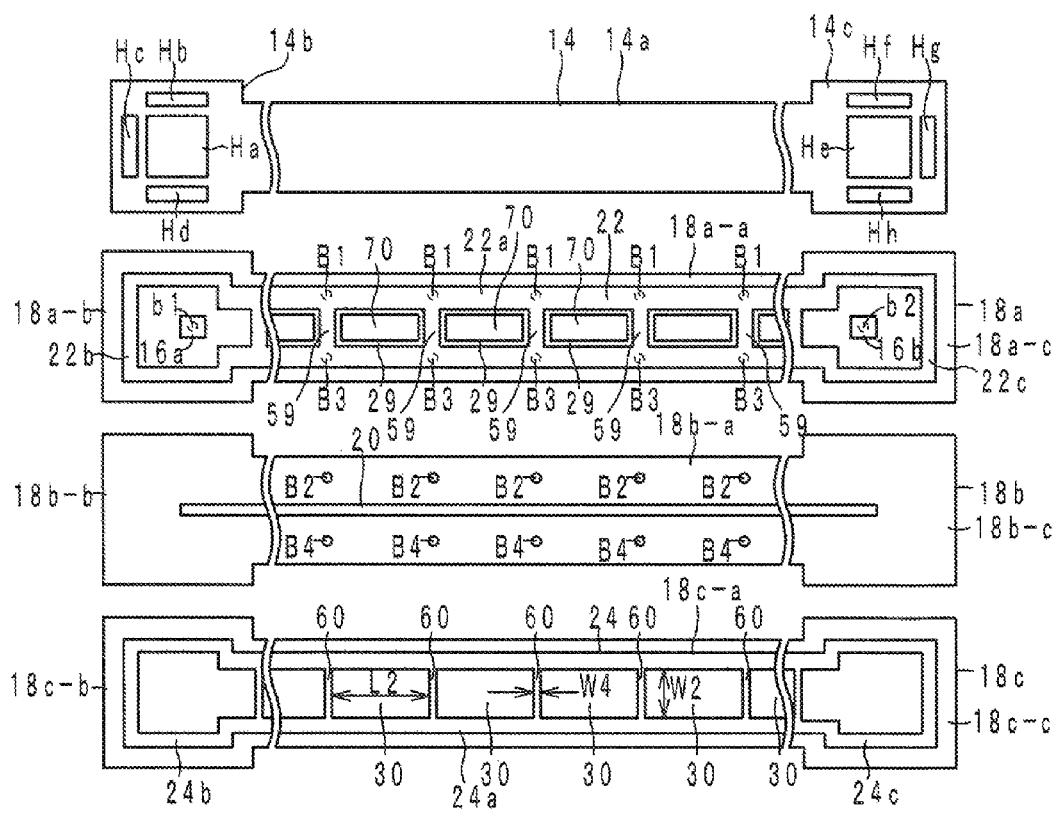
FIG. 7 is an exploded view of a dielectric element assembly of a flat cable according to a first modification of a preferred embodiment of the present invention.
Figure 8:
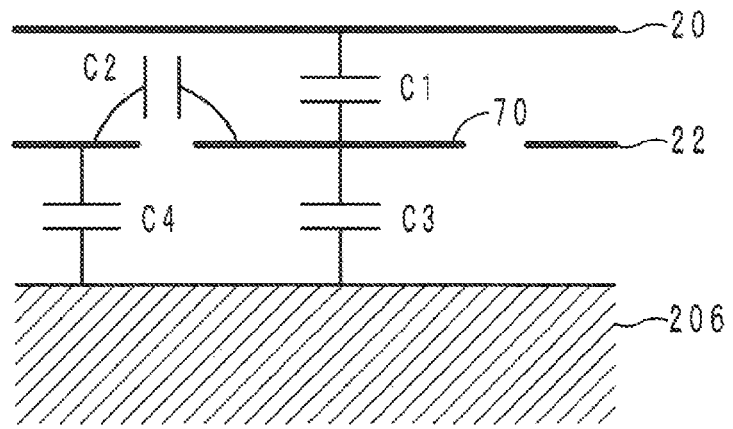
FIG. 8 is an equivalent circuit diagram where the flat cable according to the first modification is attached to a battery pack.

The configuration of a flat cable according to a first modification of a preferred embodiment of the present invention will be described below with reference to the drawings. FIG. 7 is an exploded view of the dielectric element assembly 12 of the flat cable 10a according to the first modification. FIG. 8 is an equivalent circuit diagram where the flat cable 10a according to the first modification is attached to the battery pack 206.

The flat cable 10a differs from the flat cable 10 in that it includes floating conductors 70. The floating conductors 70 are provided on the positive side in the z-axis direction relative to the signal line 20, and are not connected to other conductors. Moreover, the floating conductors 70 overlap with the openings 29 when viewed in a plan view in the z-axis direction. In the present preferred embodiment, the floating conductors 70 are positioned within the openings 29 on the front surface of the dielectric sheet 18a where the reference ground conductor 22 is provided. The floating conductors 70 preferably are rectangular or substantially rectangular portions, smaller than the openings 29 and out of contact with the reference ground conductor 22.

Since the flat cable 10a as above has the floating conductors 70 provided in the openings 29, spurious radiation is prevented from being emitted to the outside through the openings 29.

Further, the characteristic impedance of the signal line 20 is prevented from fluctuating. More specifically, in the case of the flat cable 10a provided with the floating conductors 70, capacitance C1 is created between the signal line 20 and each floating conductor 70, and capacitance C2 is created between the floating conductor 70 and the reference ground conductor 22, as shown in FIG. 8. The value of the capacitance C1 is high because the signal line 20 is opposed to the floating conductor 70. On the other hand, the value of the capacitance C2 is very low because the reference ground conductor 22 is not opposed to the floating conductor 70. Moreover, the capacitances C1 and C2 are connected in a series, and therefore, the combined value of the capacitances C1 and C2 is equal or approximately equal to the value of the capacitance C2. Accordingly, providing the floating conductors 70 results in a very small increase in the capacitance created between the signal line 20 and the reference ground conductor 22, which is equal or approximately equal to the value of the capacitance C2. Thus, in the case of the flat cable 10a, the characteristic impedance of the signal line 20 fluctuates because of the floating conductors 70, but such fluctuations are small.

Figure 9:
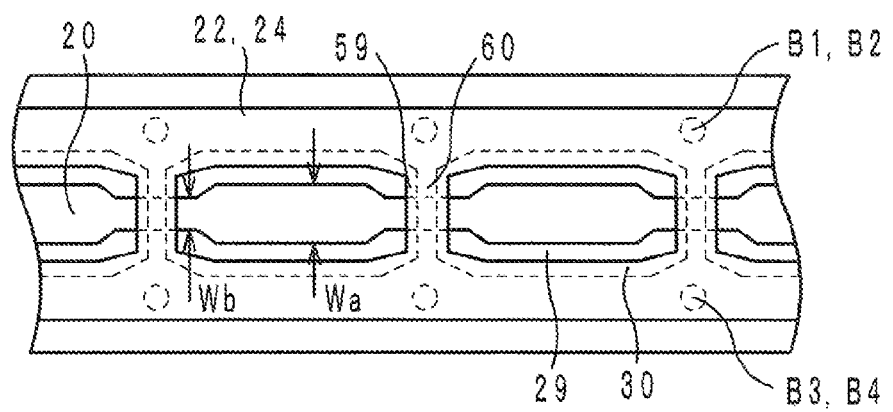
FIG. 9 illustrates a signal line, a reference ground conductor, and an auxiliary ground conductor of a flat cable according to a second modification of a preferred embodiment of the present invention as viewed in a plan view in the direction of lamination.
Figure 9:
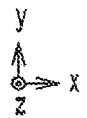

The configuration of a flat cable according to a second modification of a preferred embodiment of the present invention will be described below with reference to the drawings. FIG. 9 illustrates a signal line, a reference ground conductor, and an auxiliary ground conductor of the flat cable 10b according to the second modification as viewed in a plan view in the direction of lamination.

The flat cable 10b differs from the flat cable 10 in terms of the shapes of the signal line 20 and the openings 29 and 30. More specifically, the openings 29 and 30 are tapered at both ends in the x-axis direction. That is, the width of each of the openings 29 and 30 in the y-axis direction decreases from vicinities of both ends in the x-axis direction toward the ends.

Furthermore, when the flat cable 10b is viewed in a plan view in the z-axis direction, the width Wa of the signal line 20 where it overlaps with the openings 29 and 30 is greater than the width Wb of the signal line 20 where it overlaps with the bridge portions 59 and 60. More specifically, the signal line 20 is tapered so that its width changes as above.

In the flat cable 10b, since the openings 29 and 30 are tapered at both ends in the x-axis direction, the width of the gap between the signal line 20 and the openings 29 and 30 gradually decreases toward the ends in the x-axis direction. Accordingly, the number of magnetic flux lines that pass through the gap gradually decreases toward the ends of each of the openings 29 and 30 in the x-axis direction, and the inductance value of the signal line 20 gradually decreases as well. As a result, the characteristic impedance of the signal line 20 fluctuates more gently, so that high-frequency signal reflection in the signal line 20 is prevented.

Furthermore, in the flat cable 10b, less capacitance is created where the signal line 20 overlaps with the openings 29 and 30 between the signal line 20 and the reference ground conductor 22 and also between the signal line 20 and the auxiliary ground conductor 24. Therefore, even if the width Wa of the signal line 20 is increased in order to reduce insertion loss, capacitance does not become excessively large between the signal line 20 and the reference ground conductor 22 and also between the signal line 20 and the auxiliary ground conductor 24. Thus, it is possible to prevent fluctuations in the characteristic impedance of the signal line 20 and also reduce insertion loss in the flat cable 10b.

Other Preferred Embodiments

The present invention is not limited to the flat cables 10, 10a, and 10b, and variations can be made within the spirit and scope of the present invention.

The protective layer 14 has been described as being formed preferably by screen printing, but it may be formed by photolithography, for example.

Furthermore, the length L1 of the opening 29 may be greater than or equal to the length L2 of the opening 30.

Furthermore, the opening 29, when viewed in a plan view in the z-axis direction, may extend at least partially beyond the opening 30.

Furthermore, a metallic object may be used in place of the battery pack 206. Examples of the metallic object include a housing and a printed circuit board.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal line comprising:
    a dielectric element assembly including a plurality of dielectric layers laminated on each other in a lamination direction;
    a linear signal line provided in the dielectric element assembly;
    a first ground conductor provided on one side in the lamination direction relative to the signal line and including a plurality of first openings arranged along the signal line; and
    a second ground conductor provided on the other side in the lamination direction relative to the signal line and including a plurality of second openings arranged along the signal line; wherein
    each of the plurality of first openings is located within a respective one of the plurality of second openings when viewed in the lamination direction; and
    edges of the plurality of first openings do not overlap with edges of the plurality of second openings when viewed in the lamination direction.

2. The high-frequency signal line according to claim 1, wherein the signal line overlaps with each of the plurality of first openings and the plurality of second openings.

3. The high-frequency signal line according to claim 1, wherein
    the first ground conductor includes first bridge portions located between adjacent first openings of the plurality of first openings;
    the second ground conductor includes second bridge portions located between adjacent second openings of the plurality of second openings; and
    the signal line, when viewed in the lamination direction, is wider in portions that overlap with the plurality of first openings and the plurality of second openings than in portions that overlap with the first and second bridges.

4. The high-frequency signal line according to claim 1, further comprising:
    floating conductors provided on the one side in the lamination direction relative to the signal line and not connected to other conductors; wherein
    the floating conductors, when viewed in the lamination direction, overlap with the plurality of first openings.

5. The high-frequency signal line according to claim 1, wherein the dielectric element assembly is flexible.

* * * * *